(12) United States Patent
Naseef et al.

(10) Patent No.: US 10,686,537 B2
(45) Date of Patent: Jun. 16, 2020

(54) MEASURING SYSTEM AND METHOD FOR DETERMINING PHASE DIFFERENCES OF ANTENNA ELEMENTS OF AN ANTENNA ARRAY

(71) Applicant: Rohde & Schwarz GmbH & Co. KG, Munich (DE)

(72) Inventors: Mahmud Naseef, Munich (DE); Gareth Lloyd, Munich (DE); Markus Reil, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/340,394

(22) Filed: Nov. 1, 2016

(65) Prior Publication Data

US 2018/0076906 A1  Mar. 15, 2018

Related U.S. Application Data

(60) Provisional application No. 62/405,842, filed on Oct. 7, 2016.

(30) Foreign Application Priority Data

Sep. 12, 2016   (EP) ..................................... 16188305

(51) Int. Cl.
  H04B 17/10   (2015.01)
  H01Q 3/26   (2006.01)
  (Continued)

(52) U.S. Cl.
  CPC ............ H04B 17/102 (2015.01); G01R 27/28 (2013.01); G01R 29/10 (2013.01); H01Q 3/24 (2013.01);
  (Continued)

(58) Field of Classification Search
  CPC ........ H01Q 3/267; H01Q 21/061; H01Q 3/12; H04B 17/0085; H04B 17/12;
  (Continued)

(56) References Cited

U.S. PATENT DOCUMENTS

| 7,098,847 | B2 | 8/2006 | Li | |
|---|---|---|---|---|
| 9,705,611 | B1 | 7/2017 | West | |
| 2002/0089447 | A1 | 7/2002 | Li | |
| 2002/0171583 | A1* | 11/2002 | Purdy | .................... H01Q 3/267 342/368 |
| 2003/0236107 | A1* | 12/2003 | Azuma | .................. H01Q 3/267 455/561 |
| 2006/0009162 | A1 | 1/2006 | Tan | |
| 2007/0194776 | A1 | 8/2007 | Bossche | |

(Continued)

OTHER PUBLICATIONS

Bailey, "5G Outlook Test and Measurement Aspects", http://cwbackoffice.co.uk/Presentation/RTSS%2003.02.15%20Rohde&Schwarz.pdf, XP002767221, Feb. 3, 2015.

(Continued)

*Primary Examiner* — Ricardo I Magallanes
(74) *Attorney, Agent, or Firm* — Potomac Technology Law, LLC

(57) ABSTRACT

A measuring system for determining phase differences of antenna element signals of antenna elements of an antenna array under test is provided. The measuring system comprises a signal generating means, which is configured to provide a measuring signal to the antenna array under test over the air and receiving means configured to measure the antenna element signals, resulting from receiving the measuring signal by the antenna elements of the antenna array under test and determine the phase difference of the antenna element signals.

16 Claims, 3 Drawing Sheets

(51) Int. Cl.
  *H04B 17/16* (2015.01)
  *H01Q 3/24* (2006.01)
  *H01Q 21/00* (2006.01)
  *G01R 27/28* (2006.01)
  *G01R 29/10* (2006.01)
  *H04B 1/00* (2006.01)
  *H04B 17/00* (2015.01)
  *H04B 17/19* (2015.01)
  *G01N 1/00* (2006.01)

(52) U.S. Cl.
  CPC ............. *H01Q 3/267* (2013.01); *H01Q 21/00* (2013.01); *H04B 17/101* (2015.01); *H04B 17/16* (2015.01); *G01N 1/00* (2013.01); *H04B 1/00* (2013.01); *H04B 17/0085* (2013.01); *H04B 17/19* (2015.01); *H04B 2201/00* (2013.01)

(58) Field of Classification Search
  CPC .... H04B 7/0897; H04B 7/086; H04B 17/101; H04B 17/16; G01R 23/005; G01R 27/28
  See application file for complete search history.

(56) References Cited

U.S. PATENT DOCUMENTS

| | | | |
|---|---|---|---|
| 2010/0328073 A1* | 12/2010 | Nikitin | G01S 5/0247 340/572.1 |
| 2011/0267216 A1* | 11/2011 | Smith | G01S 3/023 342/30 |
| 2013/0343490 A1 | 12/2013 | Wertz | |
| 2016/0043778 A1* | 2/2016 | Sikina | H04B 5/0043 455/41.1 |
| 2016/0095171 A1 | 3/2016 | Chaimov et al. | |
| 2016/0174456 A1 | 6/2016 | Barychev et al. | |
| 2016/0269093 A1 | 9/2016 | Seol et al. | |
| 2017/0201020 A1* | 7/2017 | Chou | G01R 29/10 |
| 2017/0336454 A1* | 11/2017 | Hinotani | G01R 29/10 |

OTHER PUBLICATIONS

EPO, "Extended European Search Report", EPO Application No. 16188305.3, dated Feb. 24, 2017.
Naseef, et al., "Characterizing Active Phased Array Antennas", Rohde & Schwarz Application Note, 8.2016-1MA248_2e, https://www.rohde-schwarz.com/appnote/1MA248, Aug. 2016.

* cited by examiner

MEASURING SYSTEM AND METHOD FOR DETERMINING PHASE DIFFERENCES OF ANTENNA ELEMENTS OF AN ANTENNA ARRAY

RELATED APPLICATIONS

This application claims priority from European patent application EP16188305.3 (filed 2016 Sep. 12), which is incorporated herein by reference in its entirety, and claims the benefit of the earlier filing date under 35 U.S.C. § 119(e) from U.S. Provisional Application Ser. No. 62/405,842 (filed 2016 Oct. 7), which is incorporated herein by reference in its entirety.

FIELD

The present invention relates to measuring the phase differences in the signals of antenna elements of an antenna array under test, such as where the antenna array is an antenna array of a mobile communications system.

BACKGROUND

During recent years, a strong trend for multiple input multiple output (MIMO) in communications devices has developed, such as antenna arrays used for performing a beamforming of signals to be transmitted.

For example, the patent publication US20160269093A1 shows a communications system employing MIMO.

Currently, however, systems for measuring the phase differences of the antenna element signals within such antenna arrays require a complex hardware implementation.

What is needed, therefore, is a measuring system and associated method for measuring the phase differences of the antenna element signals within antenna arrays in a communications system via a low complexity, efficient and quick manner.

SOME EXAMPLE EMBODIMENTS

Embodiments of the present invention advantageously address the foregoing requirements and needs, as well as others, by providing measuring systems and associated methods for measuring the phase differences of the antenna element signals within antenna arrays in a communications system via a low complexity, efficient and quick manner.

In accordance with example embodiments, a measuring system for determining phase differences of antenna element signals of antenna elements of an antenna array under test is provided. The measuring system comprises a signal generator configured to provide a measuring signal to the antenna array under test over the air. The system further comprises a receiver configured to measure the antenna element signals, resulting from receiving the measuring signal by the antenna elements of the antenna array under test, and to determine the phase differences of the antenna element signals. It is thereby possible to measure the phase differences without requiring a great hardware effort.

By way of example, the measuring system is configured so that all the antenna elements of the antenna array receive the measuring signal. It is thereby possible to determine the phase differences of all antenna element signals without requiring a repetition of the measurement.

By way of example, the receiver includes a plurality of measuring ports. Further, the receiver may be configured to receive the antenna elements in parallel. This allows for a quick and efficient measurement.

According to a further embodiment, the receiver is configured to measure one or more of the amplitude, voltage and current of the antenna element signals. This allows for determining a great deal of information of the antenna signals as well as to handle a great deal of different antenna element types.

By way of further example, the receiver may comprise one of an oscilloscope, a vector network analyzer, a chain of synchronized vector network analyzers, and a chain of synchronized oscilloscopes. A simple setup of the measuring system without a great hardware effort is thereby possible. Also, a great flexibility regarding the number of available measurement ports is thereby achieved.

By way of further example, the receiver includes a measuring port for each of the antenna elements of the antenna array. The receiver is configured to measure each of the antenna element signals using one of said measuring ports. This allows for an especially quick measurement.

According to a further embodiment, the measuring system further comprises a positioning or orienting unit configured to position or orient the device under test in a number of predefined orientations. The receiver is then configured to receive and measuring the antenna element signals successively in each of the number of predefined orientations. This allows for a determining of phase differences of the antenna elements for different orientations. For example, for determining if a beamforming is successful, this measurement is useful. By way of example, the positioning unit is configured to position or orient the device under test about one or more of a horizontal axis (e.g., by 360°) and about a vertical axis (e.g., by 360°). This allows for a complete measurement of the entire space of possible signal directions.

According to a further embodiment, the receiver is configured to compare the measured phase differences of the antenna element signals in each of the orientations of the number of predefined orientations to expected phase differences of the antenna element signals in the respective orientation. This allows for a determining, if the respective antenna array under test fulfills the expectations.

According to a further embodiment, the signal generator and the receiver are connected to each other. The signal generator, in a first alternative, controls the receiver and the positioning unit. Alternatively, the receiver controls the signal generator and the positioning unit.

According to a further embodiment, the system further comprises a controller, which is connected to one or more of the signal generator, the receiver and the positioning unit. In this case, the controller controls the signal generator, the receiver and the positioning unit. This allows for a flexible setup of the measuring system.

According to one embodiment, the measuring signal is a continuous wave signal or a modulated signal. Different requirements regarding the complexity of the signal generator and regarding the measurements to be performed can thereby be addressed.

According to a further embodiment, the signal generator comprises a signal generating antenna configured to transmit the measuring signal over the air to the antenna array under test. This allows for a quick and efficient generating of the measuring signal.

According to a further embodiment, the signal generator comprises a single signal generator or a plurality of synchronized signal generators configured to generate the measuring signal including a beamforming. Further, the signal generator comprises a signal generating antenna array, configured to transmit the measuring signal according to the beamforming to the antenna array under test. The single signal generator or the plurality of synchronized signal generators are configured to generate the beamforming of the measuring signal so that the measuring signal is successively targeted at different antenna elements of the antenna array under test. It is thereby possible to determine the phase difference of antenna element signals, in case that the entire antenna array under test receives the measuring signal.

According to a further embodiment, the measuring system further comprises an anechoic chamber, housing all other components of the measuring system and the device under test. This allows for further reducing stray emissions negatively influencing the measuring accuracy.

In accordance with further example embodiments, a measuring method for determining phase differences of antenna element signals of antenna elements of an antenna array under test is provided. The measuring method comprises providing a measuring signal to the antenna array under test over the air, receiving the measuring signal by the antenna elements of the antenna array under test, resulting in a plurality of antenna array signals, measuring the antenna array signals, and determining the phase differences of the antenna array signals therefrom. It is thereby possible to measure the phase differences without requiring a great hardware effort. Further, the features of the foregoing system embodiments are also relevant to the method embodiments.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

Figure 1:
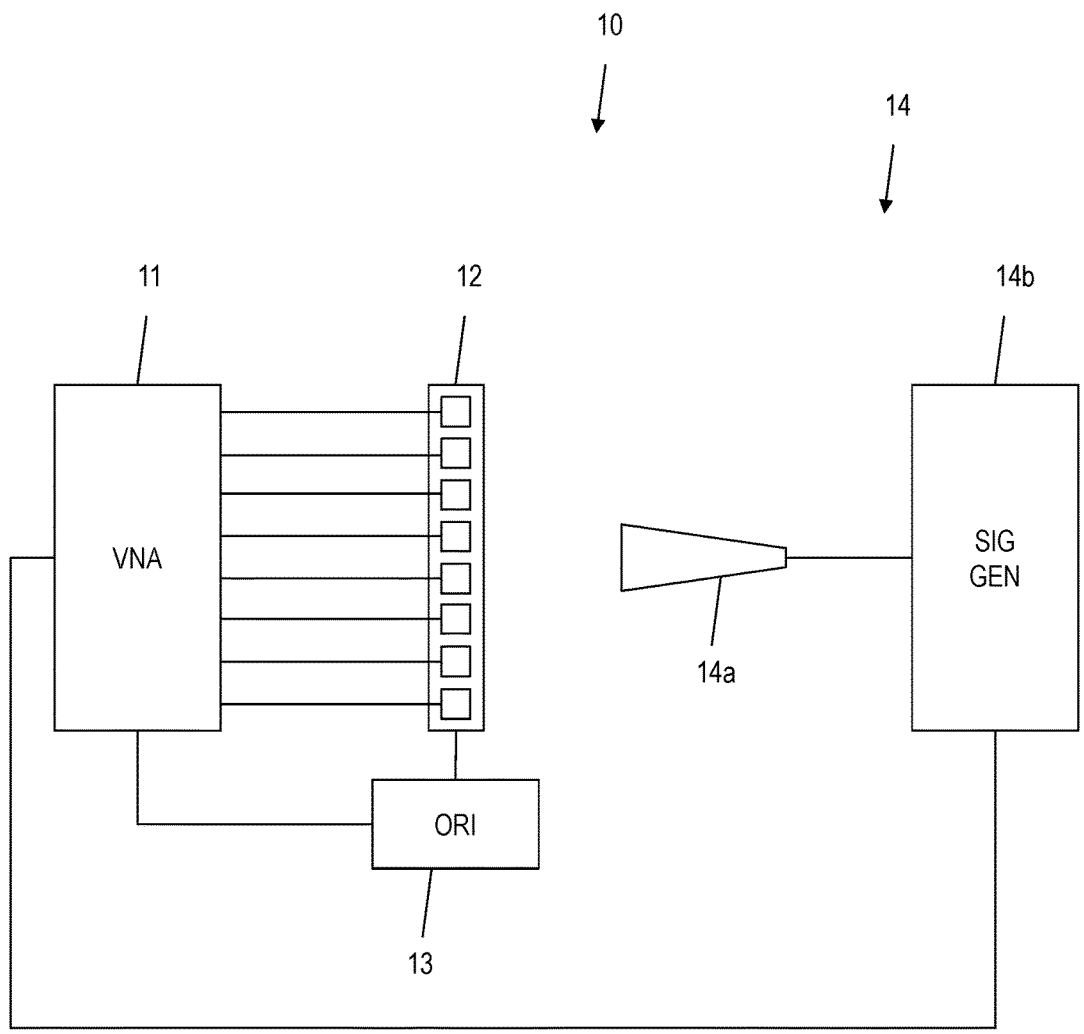
FIG. 1 shows a block diagram of a first example measuring system, in accordance with example embodiments of the present invention.

Approaches for measuring systems and associated methods for measuring the phase differences of the antenna element signals within antenna arrays in a communications system via a low complexity, efficient and quick manner, are described. It is apparent, however, that embodiments of the present invention may be practiced without these specific details or with an equivalent arrangement. In other instances, well-known structures and devices are shown in block diagram form in order to avoid unnecessarily obscuring the invention.

As will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Further, terminology referring to computer-readable media or computer media or the like as used herein refers to any medium that participates in providing instructions to the processor of a computer or processor module or component for execution. Such a medium may take many forms, including but not limited to non-transitory non-volatile media and volatile media. Non-volatile media include, for example, optical disk media, magnetic disk media or electrical disk media (e.g., solid state disk or SDD). Volatile media include dynamic memory, such random access memory or RAM. Common forms of computer-readable media include, for example, floppy or flexible disk, hard disk, magnetic tape, any other magnetic medium, CD ROM, CDRW, DVD, any other optical medium, random access memory (RAM), programmable read only memory (PROM), erasable PROM, flash EPROM, any other memory chip or cartridge, or any other medium from which a computer can read data.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Different embodiments of measuring systems according to aspects of the present invention are first described with reference to FIG. 1 and FIG. 2. Then, a measuring method according to aspects of the present invention are described with reference to FIG. 3. Similar entities and reference numbers in different figures have been partially omitted.

FIG. 1 shows a block diagram of a first example measuring system 10, in accordance with example embodiments of the present invention. The measuring system 10 comprises a signal generator component 14, a receiver 11 and an positioning unit 13. The signal generator component 14 comprises a signal generator 14b and a signal generating antenna 14a, which are connected to each other. The receiver 11 is connected to the positioning unit 13 and to the signal generator component 14 (e.g., to the signal generator 14b). By way of example, the receiver 11 may comprise a vector network analyzer. The receiver 11 is further connected to an antenna array under test 12 by a number of cable connections. The antenna array 12 thereby comprises a number of individual antenna elements, which are each connected to a measuring port of the receiver 11. The antenna array under test 12 is mounted on the positioning unit 13.

The positioning unit 13 is configured to position or orient the antenna array under test 12 into a number of predefined orientations. The positioning unit 13 can be a simple turntable, which is setup for turning the antenna array under test 12 (e.g., by 360°) around a vertical axis. Alternatively, the positioning unit 13 can orient or position the antenna array under test 12 around a horizontal axis (e.g., by 360°). Further, an orientation around both axes is also possible. In the embodiment of FIG. 1, the positioning unit 13 and the signal generator 14 are controlled by the receiver 11. Alternatively, the control of the positioning unit 13 and the signal generator 14 can be performed by the signal generator 14b. In such a case, the positioning unit 13 would be connected to the signal generator 14b instead of the vector network analyzer 11. Also a control by a separate controller, as shown in FIG. 2, is also possible.

For performing a measurement, in this embodiment, the vector network analyzer 11 instructs the positioning unit 13 to orient the antenna array under test 12 into a first desired orientation. Then the vector network analyzer 11 instructs the signal generator 14b to generate a measuring signal and emit it by use of the signal generating antenna 14a. The measuring signal is emitted by the signal generating antenna 14a over the air towards the antenna array under test 12. The antenna array under test 12 receives the measuring signal. For example, the individual antenna elements of the antenna array under test 12 receive the measuring signal. The received measuring signal is transmitted by the individual antenna elements to the vector network analyzer 11, for example, each to an individual measuring port of the vector network analyzer 11.

Alternatively, a number of synchronized vector network analyzers can be used, for example, if a single vector network analyzer does not have enough measuring ports. Further, instead of a vector analyzer 11, an oscilloscope or a linked and synchronized chain of oscilloscopes can be used.

The vector network analyzer, after receiving the individual antenna element signals, measures these and therefrom determines the phase differences in the present orientation. After finishing this first turn of measurements, the vector network analyzer 11 instructs the positioning unit to orient the antenna array under test 12 in a new orientation. Then the respective measurements are repeated. This process is repeated until all desired or predefined orientations have been covered.

Figure 2:
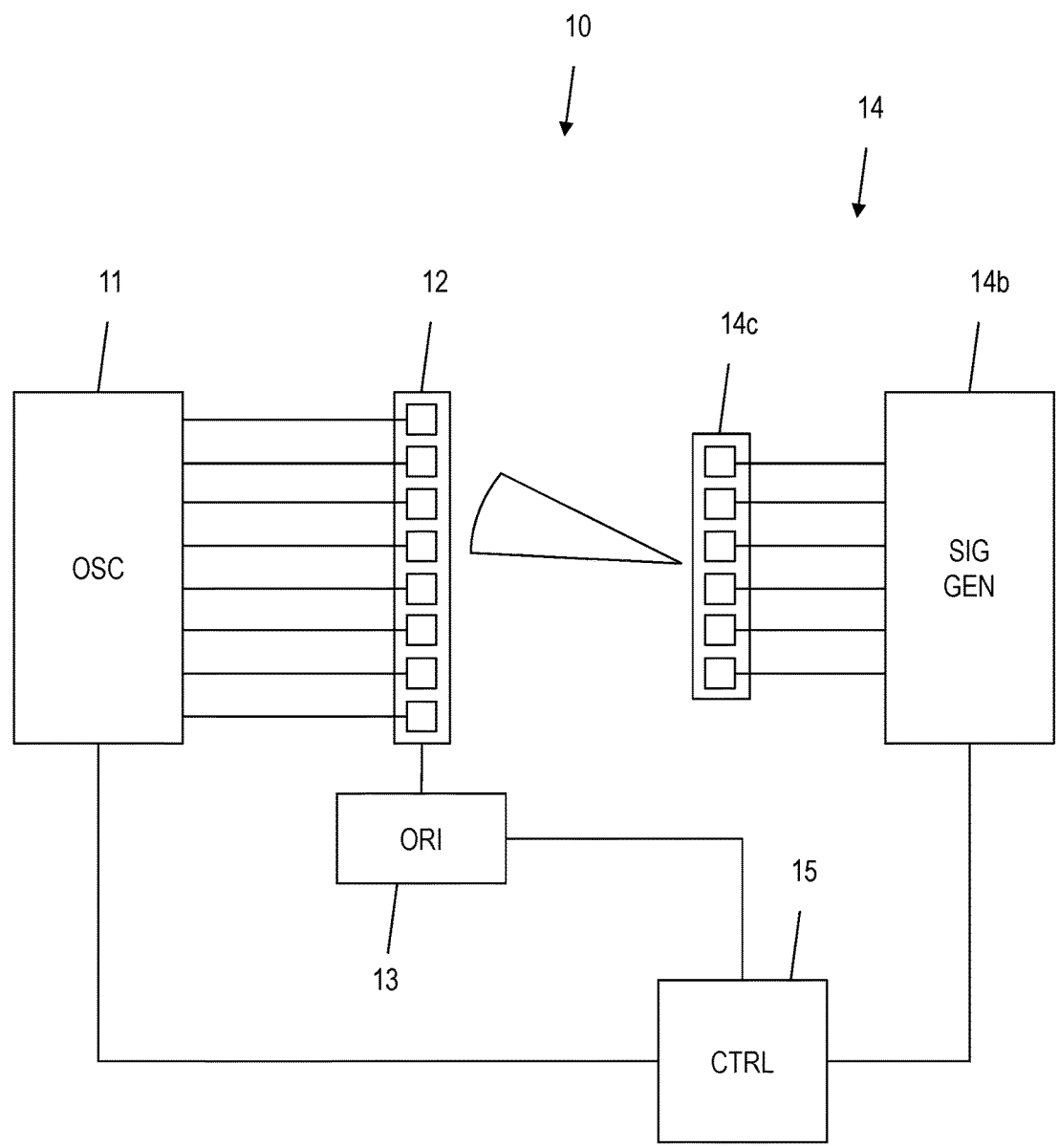
FIG. 2 shows a block diagram of a second example measuring system, in accordance with example embodiments of the present invention.

FIG. 2 shows a block diagram of a second example measuring system 10, in accordance with example embodiments of the present invention. In this embodiment, the receiver 11 comprises an oscilloscope. Also, in this embodiment, the measurement is not controlled by the signal generator 14 or the receiver 11, but by a separate controller 15, which is connected to the signal generator 14, to the receiver 11 and to the positioning unit 13.

Further, in the present embodiment, the signal generating antenna 14a is replaced by a signal generating antenna array 14c. When performing a measurement, the signal generator 14b generates the measuring signal including a beamforming and provides it to the signal generating antenna array 14c, which emits the measuring signal including the beamforming. This is indicated by a transmission beam within the figure. By use of this beamforming, it is possible to direct the measurement signal to individual antenna elements or groups of antenna elements within the antenna array under test 12.

With regard to the embodiments of both FIG. 1 and FIG. 2 are made the following apply:

The measuring signal can be a continuous wave signal (CW) or a modulated signal. In case of a continuous wave signal, it is possible to determine the actual phase difference, no matter if an oscilloscope or a vector network analyzer is used as a receiver. On the other hand, it is possible to use a modulated measuring signal. In this case, however, determination of the phase difference is relatively more difficult if using an oscilloscope. On the other hand, when using a vector network analyzer, the determination of the phase difference is simplified, since no ambiguity regarding 360°-shifted signals is possible with modulated measuring signals.

When measuring the individual antenna element signals, the receiver 11 can determine one or more of an amplitude, a voltage and a current of the respective signals. This allows for measuring different antenna element types and thereby results in a great measuring flexibility.

After determining the phase differences of the individual antenna element signals, it is further possible to determine if the determined phase differences are within a tolerable range. For this purpose, the phase differences can be compared to ideal values, for example determined from a gold standard antenna array under test. Also theoretical ideal values can be used.

According to a further embodiment, it is possible to determine if the measured phase differences correspond to the present orientation of the antenna array under test 12. For this purpose, the measured and determined phase differences can be compared to ideal values for a number of different predetermined orientations.

According to a further embodiment, it is possible to use respective reference ports of the receiver 11, for example, in case the receiver 11 does not comprise enough regular measuring ports, such as in case the receiver comprises a vector network analyzer, in order to substitute additional measuring ports.

Further, apart from comparing the phase differences of the different antenna element signals, also a determination of one or more of amplitude differences, voltage differences and current differences is possible.

Figure 3:
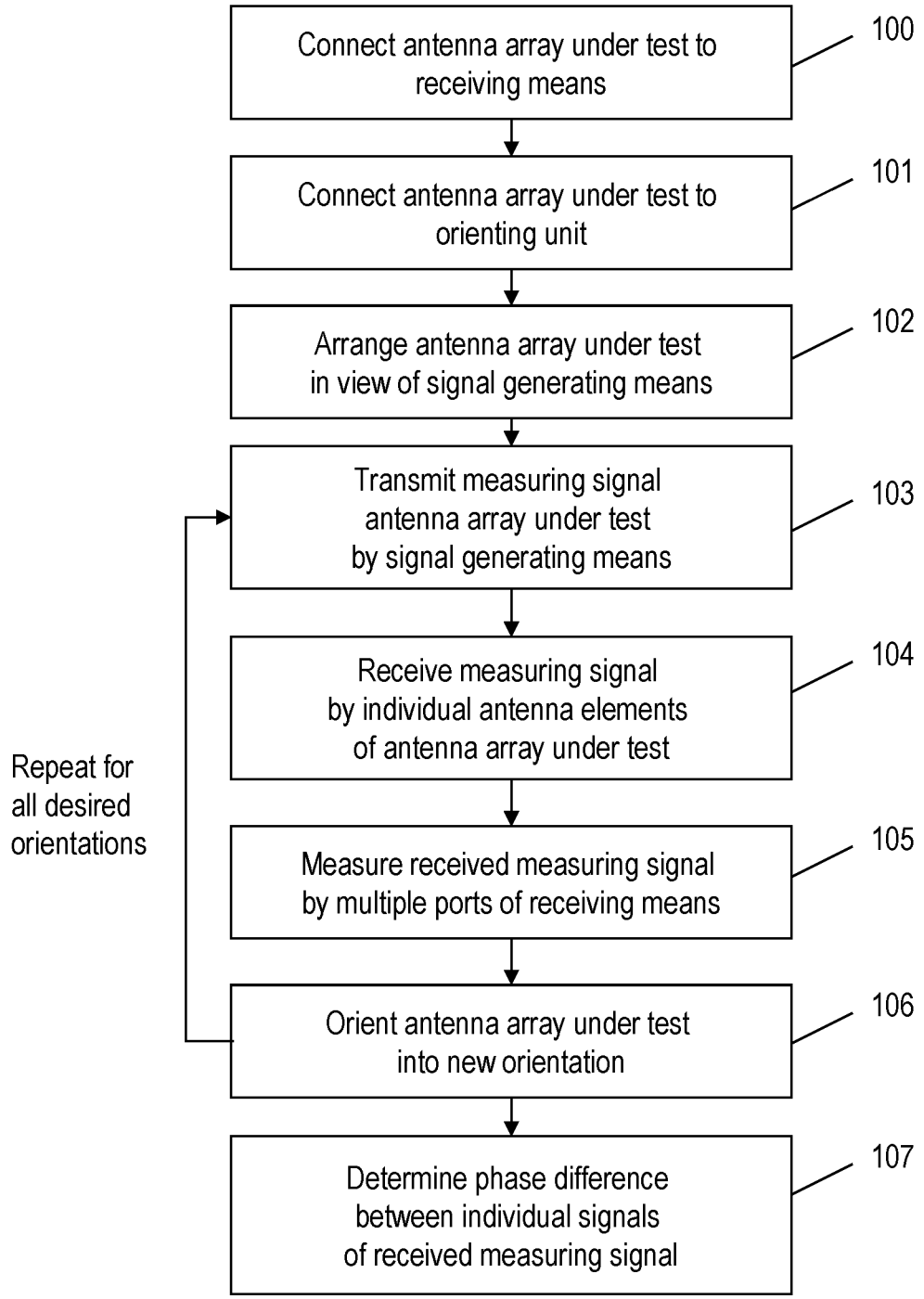
FIG. 3 shows a flow chart of a measuring method, in accordance with example embodiments of the present invention.

FIG. 3 shows a flow chart of a measuring method, in accordance with example embodiments of the present invention. In step 100, an antenna array under test is connected to receiver. In step 101, the antenna array under test is connected to an orienting or positioning unit. In step 102, the antenna array under test is arranged in view of a signal generator. This means that a signal generating antenna of the signal generator is positioned so that it can emit a signal towards the antenna array under test, which can then be received by the antenna array under test. In step 103, a measuring signal is transmitted to the antenna array under test by the signal generator. In step 104, the measuring signal is received by individual antenna elements of the antenna array under test. In step 105, the received measuring signal is measured by multiple ports of receiver. This means that each antenna element of the antenna array under test is connected to an input port of the receiver, and the individual antenna array signals are measured individually. In step 106, the antenna array under test is oriented into a new orientation. The steps 103-106 are repeated, until measurements for all desired or predefined orientations have been performed. In step 107, phase differences between the individual antenna element signals are determined.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples. The characteristics of the exemplary embodiments can be used in any combination.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples and especially not to a specific type of device under test. The device under test can be a communications device such as a mobile telephone or a machine type communications device. Also it can be a base station. The characteristics of the exemplary embodiments can be used in any advantageous combination.

Although the present invention and its advantages have been described in detail, it should be understood, that various changes, substitutions and alterations can be made herein without departing from the spirit and scope of the invention as defined by the appended claims.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above-described embodiments. Rather, the scope of the invention should be defined in accordance with the following claims and their equivalents.

What is claimed is:

1. A measuring system comprising:
 a signal generator configured to generate a measuring signal and to wirelessly transmit the measuring signal to antenna elements of an antenna array under test, wherein each of the antenna elements of the antenna array receives the measuring signal such that phase differences of resulting antenna element signals from all of the antenna elements can be determined without requiring any repetitions of the transmission of the measuring signal;
 a positioning unit configured to position the antenna array under test in successive predefined orientations; and
 a receiver configured to receive antenna element signals resulting from the receipt of the measuring signal by the antenna elements of the antenna array under test and to measure the antenna element signals successively in each of the predefined orientations, and to determine phase differences of the antenna element signals; and
 wherein after determining the phase differences of the antenna element signals, it is determined whether the phase differences are within a tolerable range, wherein it is determined whether the phase differences correspond to a present orientation of the antenna array under test, and wherein it is determined whether a beamforming is successful.

2. The measuring system of claim 1, wherein the receiver comprises:
 a plurality of measuring ports.

3. The measuring system of claim 1, wherein the receiver is configured to receive the antenna element signals in parallel.

4. The measuring system of claim 1, wherein the receiver is configured to measure one or more of an amplitude, voltage and current of the antenna element signals.

5. The measuring system of claim 1, wherein the receiver is one of an oscilloscope, a vector network analyzer, a chain of synchronized vector network analyzers, and a chain of oscilloscopes.

6. The measuring system of claim 1, wherein the receiver comprises:
 a measuring port for each of the antenna elements of the antenna array under test; and
 wherein the receiver is configured to measure each of the antenna element signals via a respective one of the measuring ports.

7. The measuring system of claim 1, wherein the positioning unit is configured to position the antenna array under test about one or more of a horizontal axis by 360° and a vertical axis by 360°.

8. The measuring system of claim 1, wherein the receiver is configured to compare, for each of the predefined orientations, the measured phase differences of the antenna element signals to expected phase differences of the antenna element signals for the respective orientation.

9. The measuring system of claim 1, wherein the measuring system further comprises:
a controller configured to control the signal generator, the receiver and the positioning unit.

10. The measuring system of claim 1, wherein the measuring signal is one of a continuous wave signal and a modulated signal.

11. The measuring system of claim 1, wherein the signal generator comprises:
a signal generator element configured to generate the measuring signal; and
an antenna configured to wirelessly transmit the measuring signal to the antenna array under test.

12. The measuring system of claim 1, wherein the signal generator comprises:
a one of a single signal generator element and a plurality of synchronized signal generator elements configured to generate the measuring signal via the beamforming; and
an antenna array configured to transmit the measuring signal according to the beamforming to the antenna array under test; and
wherein the one of the single signal generator element and the plurality of synchronized signal generator elements is configured to perform the beamforming of the measuring signal so that the measuring signal is successively targeted at different antenna elements of the antenna array under test.

13. The measuring system of claim 1, wherein the measuring system further comprises:
an anechoic chamber housing all other components of the measuring system and the antenna array under test.

14. A measuring method comprising:
generating a measuring signal;
wirelessly transmitting the measuring signal to antenna elements of an antenna array under test, wherein each of the antenna elements of the antenna array under test receives the measuring signal such that phase differences of resulting antenna element signals from all of the antenna elements can be determined without requiring any repetitions of the transmission of the measuring signal;
positioning the antenna array under test in successive predefined orientations;
receiving, by the antenna elements of the antenna array under test, the measuring signal and measuring antenna element signals resulting from the receipt of the measuring signal by the antenna elements of the antenna array under test successively in each of the predefined orientations;
determining phase differences of the antenna element signals;
after determining the phase differences of the antenna element signals, determining whether the phase differences are within a tolerable range;
determining whether the phase differences correspond to a present orientation of the antenna array under test; and
determining whether a beamforming is successful.

15. The measuring method of claim 14, wherein the antenna element signals are received in parallel.

16. The measuring method of claim 14, wherein one or more of an amplitude, voltage and current of the antenna element signals is/are measured.

* * * * *